(12) United States Patent
Yasuzato

(10) Patent No.: US 7,910,266 B2
(45) Date of Patent: Mar. 22, 2011

(54) PATTERN FORMING METHOD AND MASK

(75) Inventor: Tadao Yasuzato, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 199 days.

(21) Appl. No.: 12/186,048

(22) Filed: Aug. 5, 2008

(65) Prior Publication Data
US 2009/0042108 A1  Feb. 12, 2009

(30) Foreign Application Priority Data
Aug. 6, 2007  (JP) .................. 2007-204509

(51) Int. Cl.
*G03F 1/00* (2006.01)
*G03F 7/00* (2006.01)
(52) U.S. Cl. .......................................... 430/5; 430/311
(58) Field of Classification Search .............. 430/5, 311, 430/322; 355/53, 71
See application file for complete search history.

(56) References Cited

U.S. PATENT DOCUMENTS

| 6,258,489 B1 * | 7/2001 | Stanton et al. ................ 430/5 |
| 6,355,382 B1 * | 3/2002 | Yasuzato et al. ............... 430/5 |
| 7,217,503 B2 * | 5/2007 | Saitoh et al. ................ 430/311 |
| 7,655,388 B2 * | 2/2010 | Tan et al. .................... 430/322 |
| 7,659,040 B2 * | 2/2010 | Setta ............................ 430/5 |
| 2004/0180294 A1 * | 9/2004 | Baba-Ali et al. ............ 430/311 |
| 2006/0197934 A1 * | 9/2006 | Yamazoe ..................... 355/71 |

FOREIGN PATENT DOCUMENTS
JP  6-19114  1/1994

* cited by examiner

*Primary Examiner* — Stephen Rosasco
*Assistant Examiner* — Stewart A Fraser
(74) *Attorney, Agent, or Firm* — Young & Thompson

(57) ABSTRACT

Hole patterns are repeatedly arranged on a mask at a constant pitch in each of predetermined directions. In the predetermined directions, a first direction with the smallest pitch and a second direction with the second smaller pitch are specified. A Levenson phase shifter is formed corresponding to the hole patterns to cause the phases of transmitted light through the hole patterns adjacent to each other in the first direction to be opposite to each other. An exposure process is performed by two-point illumination which is adapted to improve the resolution property in the second direction.

7 Claims, 15 Drawing Sheets

PATTERN FORMING METHOD AND MASK

This application is based upon and claims the benefit of priority from Japanese patent application No. 2007-204509, filed on Aug. 6, 2007, the disclosure of which is incorporated herein in its entirety by reference.

FIELD OF THE INVENTION

This invention relates to a pattern forming method and a mask and, more specifically, relates to a pattern forming method for forming a pattern corresponding to a mask on a semiconductor wafer and to the mask used in this method.

DESCRIPTION OF RELATED ART

The current photolithography technology enables the formation of a fine pattern with a width equal to or less than half an exposure wavelength by the application of a super-resolution technique. The super-resolution technique is a technique for improving the resolution by optimizing the shape of a mask illumination light source, the amplitude distribution of mask-transmitted light, or the amplitude distribution on the pupil plane. An exposure master formed with a device circuit pattern and adapted to be set in an exposure apparatus is called a mask, but is also often called a reticle when the magnification is other than 1. Hereinbelow, such an exposure master will be called a mask in either case for convenience' sake. The device circuit pattern is obtained by, for example, forming a light-shielding film of chromium or the like on a transparent substrate of quartz or the like and then etching this light-shielding film.

Oblique illumination is known as the super-resolution technique that optimizes the light source shape. The oblique illumination is a method that cuts perpendicular incident light and illuminates a mask only with oblique incident light because illumination light perpendicularly incident on the mask does not contribute to the resolution when a pattern is miniaturized. In normal illumination, it has been required to collect a zero-order beam and ±first-order beams of diffracted light for resolving a periodic pattern. This is called three-beam interference. On the other hand, in the oblique illumination, a periodic pattern of the original pitch is image-formed by two-beam interference using a zero-order beam and one of ±first-order beams of diffracted light, with the other of the ±first-order beams discarded.

In the oblique illumination, by discarding one of the ±first-order beams, the balance with the zero-order beam is degraded so that the contrast at the best focus is reduced. However, since the incidence angle on the image plane decreases to half that of the normal illumination, a reduction in contrast at a defocus decreases so that the focal depth can be increased. The focal depth represents a focal range where an effective resist pattern is obtained.

Light for illuminating a mask is obtained by a light source such as a mercury lamp or an excimer laser, but the mask is not directly illuminated by the light source. For obtaining uniform illuminance on the front surface of the mask, the light from the light source is guided to an optical element such as a fly-eye lens. The fly-eye lens is in the form of a bundle of fine rectangular single lenses, wherein the single lenses have respective focuses and thus form a group of point light sources. The point light sources respectively illuminate the front surface of the mask and, by superposition of them, uniform illumination is obtained on the front surface of the mask. The point light source group formed by the fly-eye lens is also called a secondary light source (effective light source) while the original light source is called a primary light source. Light from the effective light source is perpendicularly incident on the mask and outer-side light of the effective light source is obliquely incident on the mask.

The oblique illumination can also be realized by disposing a metal diaphragm at the focal position of the fly-eye lens, i.e. at the position where the point light source group is formed. However, if the metal diaphragm is used in the oblique illumination, energy at a light-shielding portion is wasted and thus there may arise a problem of reduction in throughput of an exposure apparatus. In view of this, some of recent exposure apparatuses have a function of forming a distribution of light entering an illumination equalizing element into a shape of oblique illumination through a lens system.

Since, in the oblique illumination, the exposure characteristics on wafers differ depending on the shape of an effective light source, there have been proposed a number of light source shapes. In terms of changing the shape of the effective light source, the oblique illumination is also called modified illumination.

FIGS. 15A, 15B, and 15C show annular illumination, four-point illumination, and two-point illumination, respectively, as typical types of oblique illumination. Herein the size of a light source is shown by projection on the pupil plane of a projection lens.

Generally, the size of a light source is given by a coherence factor σ representing a ratio thereof to that of a projection lens. The coherence factor σ is a value defined by $NA_{ill}/NA_{obj}$ where $NA_{ill}$ represents a numerical aperture (NA) of a lens of a mask illumination system and $NA_{obj}$ represents a numerical aperture of a projection lens system. The numerical aperture is the sine of the maximum incidence angle on the image plane. Accordingly, if σ>1, light from the light source does not pass through the projection lens, which is thus meaningless, and therefore, σ=1 at maximum where the illumination system and the projection lens system have the same numerical aperture.

The annular illumination shown in FIG. 15A uses an annular illumination light source 7a in which a circular light source $\sigma_{out}$ has a central portion shielded by a circle $\sigma_{in}$ that is one-size smaller than the light source $\sigma_{out}$, wherein the pattern resolution properties have no directional dependence, thus with only a small limitation on pattern layouts to be applied.

The four-point illumination shown in FIG. 15B uses four light sources 7b and is adapted to improve the resolution properties for patterns along two, i.e. X- and Y-, directions in a layout in which the patterns are formed on a mask so as to be repeated in the X- and Y-directions. In the four-point illumination, it is possible to obtain a higher contrast than that in the annular illumination with respect to patterns along the X- and Y-directions. Herein, the X- and Y-directions are, for example, directions properly set on a CAD (Computer Aided Design) and are perpendicular to each other. Further, X- and Y-coordinates defined by coordinate axes in the X- and Y-directions are X- and Y-coordinates on the CAD and, for example, correspond to coordinates in writing a mask, i.e. the coordinates on the mask.

Herein, the size of each circular light source 7b is given by a radius $\sigma_r$ and X- and Y-coordinates representing the central position of the circular light source 7b are given by Center X and Center Y. Generally, as the radius $\sigma_r$ of the light source 7b decreases, the focal depth improving effect increases, but if it is too small, the illuminance decreases to thereby affect the throughput. Therefore, the radius $\sigma_r$ is normally set to about 0.1 to 0.2. Center X and Center Y are optimized with the X- and Y-direction pitches of the patterns to be transferred onto a wafer. Generally, the four-point illumination can improve the focal depth of patterns along the X- and Y-directions, but reduces the focal depth of patterns along other directions. Therefore, in the four-point illumination, applicable pattern layouts are limited.

The two-point illumination shown in FIG. 15C is specialized for improving the resolution of patterns along a single direction in a layout in which the patterns are repeated in the single direction. The two-point illumination uses two light sources 7c. The two-point illumination can achieve the greatest resolution improving effect for patterns along one direction as compared with the foregoing annular illumination and four-point illumination, but may have difficulty in resolving other patterns. Therefore, it has been difficult to apply the two-point illumination to device circuit patterns. In view of this, for improving the resolution, a double exposure method has been proposed in which two masks are used so that, for example, fine patterns repeated in one direction are exposed by the two-point illumination using the first mask and other patterns are exposed by the annular illumination using the second mask.

Phase shift masks are well known as the super-resolution technique according to the mask. There have been proposed various types of phase shift masks such as the Shibuya-Levenson type and the halftone type. The Shibuya-Levenson type phase shift mask (hereinafter referred to as a "Levenson phase shift mask") is a mask in which the phases of transmitted light through adjacent openings are alternately shifted by 180 degrees, and is also called a spatial frequency modulation type phase shift mask. For inverting the phase of the transmitted light, there is a method of partially forming a transparent film or partially etching a mask substrate, thereby providing an optical path difference of a half wavelength to the transmitted light. Specifically, given that the wavelength of exposure light is $\lambda$ and the refractive index of a transparent film is n, the difference in phase of transmitted light through adjacent openings of a mask can be set to 180 degrees by satisfying a relational expression of $t=\lambda/2(n-1)$ where t represents the thickness of the transparent film. With the Levenson phase shift mask, it is possible to form sharp dark portions by the interference of light with the phase difference of 180 degrees and thus to separately resolve the fine openings.

The halftone type phase shift mask (hereinafter referred to as a "halftone phase shift mask") is a mask in which some light is leaked through light-shielding regions and the phase of the leaked light is shifted by 180 degrees from that of transmitted light through openings. Generally, metallic chromium is used as a light-shielding film of a mask. In the halftone phase shift mask, instead of this metallic chromium film, use is made of a semitransparent film of a metal oxide, an oxynitride (MoSiON), a metal fluoride (CrF), or the like. With respect to hole patterns, i.e. openings, of a mask, it is known that the focal depth becomes maximum when the amplitude distribution of transmitted light through the mask satisfies the Bessel function. According to the halftone phase shift mask, the amplitude of transmitted light can be made approximate to the Bessel function to increase the focal depth by forming a negative amplitude with transmitted light through the semitransparent film.

It is known that the effect is further enhanced by using a combination of the mask-based super-resolution technique and the illumination-based super-resolution technique, i.e. not using the super-resolution technique alone. For example, in a layout where patterns are repeated, the resolution properties can be improved by combining the halftone phase shift mask and the oblique illumination. This is because, although the oblique illumination has the drawback that the contrast is reduced due to poor balance between a zero-order beam and one of ±first-order beams, the contrast can be improved by reducing the zero-order beam using the halftone phase shift mask.

Patent Document 1 (Japanese Unexamined Patent Application Publication (JP-A) No. Hei 06-19114) proposes a combination of a Levenson phase shift mask and oblique illumination and shows a case where the resolution and the focal depth can be improved by combining the Levenson phase shift mask and the oblique illumination although small-$\sigma$ illumination with $\sigma$ being 0.3 or less is generally used in the case of the Levenson phase shift mask.

SUMMARY

The present inventor has recognized that, if the strong super-resolution techniques such as the Levenson phase shift mask and the two-point illumination are used, there arises a problem that a pattern transferred onto a wafer is largely deformed depending on a pattern layout formed on the mask. Particularly, in the case of the Levenson phase shift mask, although a high contrast can be obtained between openings with opposite phases, it cannot be obtained in a layout where openings with the same phase are close to each other, so that patterns cannot be separated. Therefore, if the Levenson phase shift mask is applied to an asymmetrical layout, separation between the openings with the same phase cannot be achieved and thus a pattern transferred onto a wafer is largely deformed.

Herein, the asymmetrical layout is a layout in which patterns on a mask are arranged asymmetrically with respect to X- and Y-axes perpendicular to each other. As one example of the asymmetrical layout, there is cited a pattern layout for use in an exposure process for DRAM (Dynamic Random Access Memory), wherein patterns are repeated obliquely. Patent Document 1 aims to improve the resolution of one-dimensional patterns, but fails to consider preventing deformation of two-dimensional patterns.

The present invention seeks to solve one or more of the above problems, or to improve upon those problems at least in part.

In one aspect, there is provided a pattern forming method that performs exposure using a mask to form a pattern corresponding to the mask on a wafer. The pattern forming method comprises repeatedly arranging rectangular patterns on the mask at a constant pitch in each of predetermined directions, and specifying, in the predetermined directions, at least one first direction in which the rectangular patterns are repeatedly arranged at the smallest pitch and a second direction in which the rectangular patterns are repeatedly arranged at a pitch next smaller than the smallest pitch. The pattern forming method further comprises forming a phase shifter, adapted to cause phases of transmitted light through the rectangular patterns adjacent to each other in the first direction to be opposite to each other, corresponding to those rectangular patterns, and performing the exposure by oblique illumination adapted to improve a resolution property in the second direction.

In another aspect, there is provided a mask for use in exposure. The mask has rectangular patterns repeatedly arranged at a constant pitch in each of predetermined directions. The predetermined directions include a first direction in which the rectangular patterns are repeatedly arranged at the smallest pitch, a second direction in which the rectangular patterns are repeatedly arranged at a pitch next smaller than the smallest pitch, and a third direction defined by the pitch in the first direction and the pitch in the second direction. The rectangular patterns adjacent to each other in the first direction are provided with a phase shifter adapted to cause phases of transmitted light through those rectangular patterns to be opposite to each other. The phase shifter is formed corresponding to the rectangular patterns. No phase shifter is provided for the rectangular patterns adjacent to each other in the second direction. The rectangular patterns adjacent to each other in the third direction are provided with another phase shifter different from the phase shifter. The other phase shifter is formed corresponding to the rectangular patterns.

According to the pattern forming method of the above aspect, since the resolution in the first direction in which the pitch is the smallest is obtained by the phase shifter and the resolution in the second direction in which the pitch is next smaller is improved by the oblique illumination, even if exposure is carried out using a mask with an asymmetrical layout, it is possible to prevent a pattern transferred onto a wafer from being largely deformed.

According to the mask of the above aspect, since the resolution in the first direction in which the pitch is the smallest and the resolution in the third direction defined by the pitches in the first and second directions are obtained by the phase shifter, the above advantage is obtained by performing exposure using this mask in the above pattern forming method.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Figure 1:
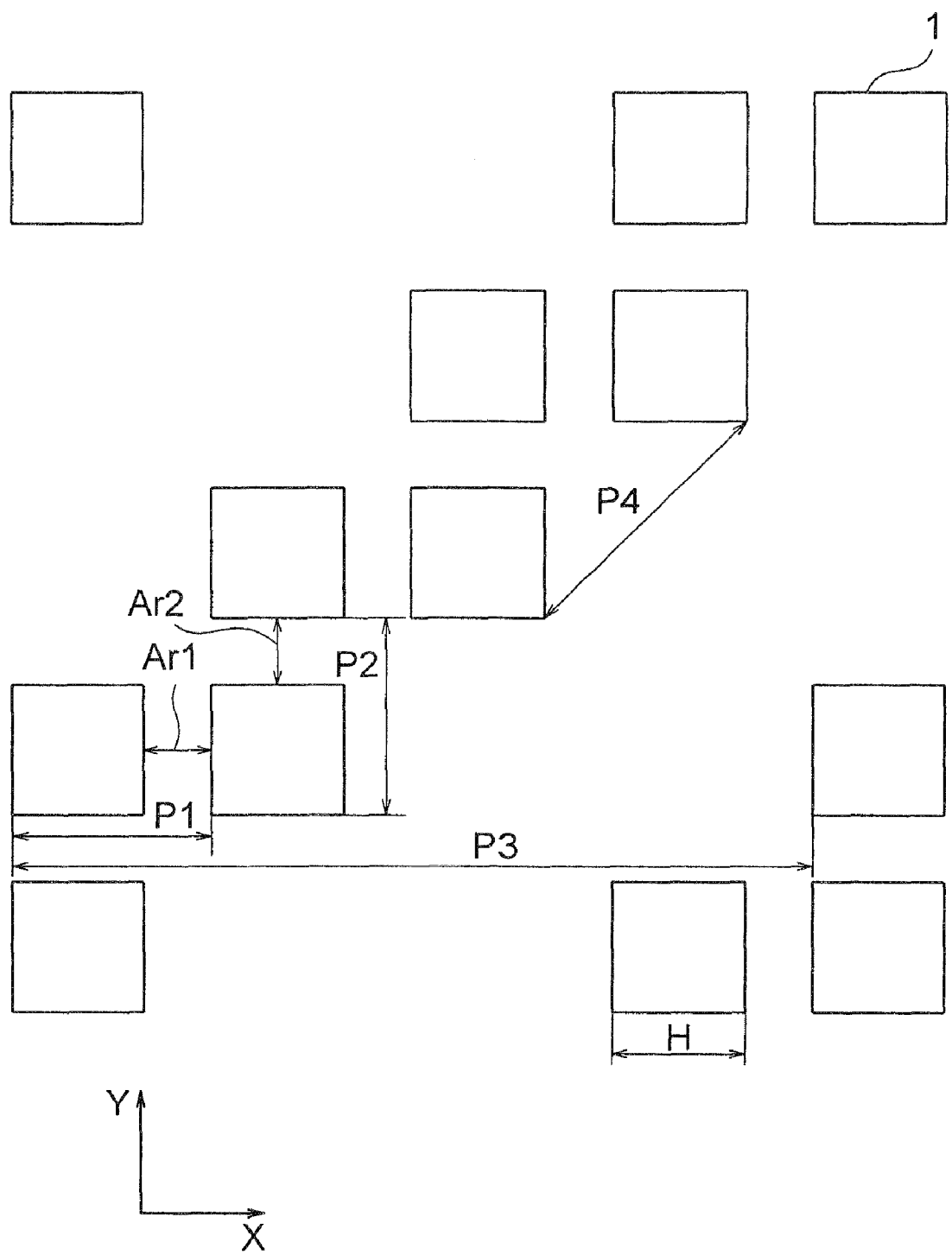
FIG. 1 is a plan view showing a layout of a mask used in a pattern forming method according to a first embodiment of this invention.

FIG. 1 is a plan view showing a layout of a mask used in a pattern forming method according to a first embodiment of this invention.

In FIG. 1, hole patterns 1 are each, for example, a square pattern and are repeated at a constant pitch in an oblique direction inclined by 45 degrees with respect to the X-direction, and arranged in every two rows. That is, the layout of this mask is an asymmetrical layout. Herein, the layout of the mask is shown as CAD data of the hole patterns 1. Hereinbelow, the pitch represents a magnitude of a vector obtained by resolving a vector, with its initial and terminal points at the centers of two patterns along a direction in which patterns are repeated, in one of the X-direction, the Y-direction, and the oblique direction, for example.

In the pattern forming method of the first embodiment, using a mask having a Levenson phase shifter formed for the hole patterns 1 arranged in a direction in which the pitch is the smallest, exposure is performed by two-point illumination that improves the resolution properties in a direction in which the pitch is next smaller (hereinafter referred to as a "direction with the second smaller pitch"). An exposure apparatus using this mask has a magnification of 4 and uses an ArF laser (wavelength=193 nm). Hereinbelow, the steps of the pattern forming method will be described.

At first, the hole patterns 1 are repeatedly arranged on a mask at a constant pitch in each of the predetermined directions (i.e. the X-direction, the Y-direction, and the oblique direction). Specifically, a mask size H of each hole pattern 1 is for forming a hole of 80 nm on a wafer and is set to 90 nm by adding a bias of 10 nm in consideration of MEEF (Mask Error Enhancement Factor). The MEEF represents a magnitude of a size change of a pattern transferred onto a wafer due to a change in mask size. Pitches P1 and P2 of the adjacent hole patterns 1 in the X- and Y-directions, respectively, are each set to 140 nm. A pitch P3 per two rows of the hole patterns 1 is set to 560 nm. A pitch P4 in the oblique direction is set to 198 nm. With this configuration, it is specified that, in the layout shown in FIG. 1, the direction with the smallest pitch is the X-direction and the Y-direction and the direction with the second smaller pitch is the oblique direction. In this case, it is difficult to separate the hole patterns relating to the X- and Y-directions indicated by arrows Ar1 and Ar2, respectively. This problem is solved by the following technique.

Figure 2:
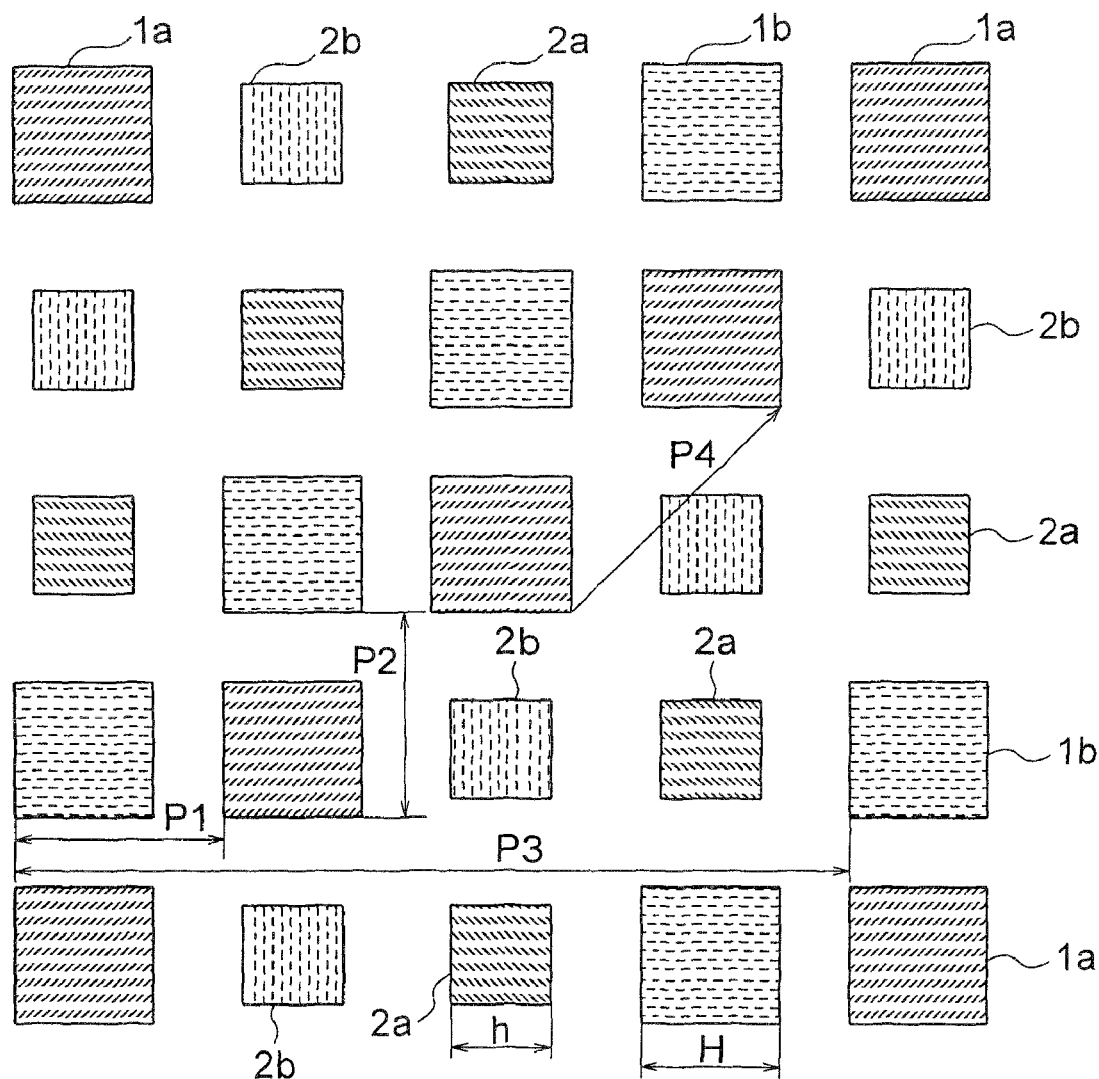
FIG. 2 is a plan view of a mask showing an example of the layout of hole patterns and auxiliary patterns shown in FIG. 1.

A phase shifter adapted to cause the phases of transmitted light through the hole patterns 1 adjacent to each other in the X- and Y-directions, respectively, each specified as the direction with the smallest pitch to be opposite to each other is formed for those hole patterns 1. Specifically, as shown in FIG. 2, the phase shifter is formed so as to obtain a phase shift effect between the hole patterns 1 adjacent to each other at the pitches P1 and P2, respectively, i.e. an effect of forming sharp dark portions by the light with the inversed phase. In the layout shown in FIG. 2, for inverting the phase of the transmitted light per row in the oblique direction of the hole patterns 1 adjacent to each other at the pitches P1 and P2, respectively, the phase shifter is formed so as to, for example, set the row of the hole patterns 1a to a phase of 0 degrees and set the row of the hole patterns 1b to a phase of 180 degrees. For setting the phase to 180 degrees, data of the phase shifter is formed in the CAD data, while, in the actual mask, a mask substrate is etched to a predetermined depth at positions corresponding to those of the phase shifter.

Further, in FIG. 2, auxiliary patterns 2a and 2b are arranged in two rows between the rows in the oblique direction of the hole patterns 1a and 1b and the rows in the oblique direction of the hole patterns 1a and 1b adjacent to the former rows at the pitch P3 in the X-direction. The auxiliary patterns 2a and 2b each have a size of exposure light limiting resolution or less and thus are not transferred onto a wafer, and further, are capable of narrowing the light intensity distribution of the hole patterns 1a and 1b and improving the contrast. Therefore, the auxiliary patterns 2a and 2b can improve the resolution even if the hole patterns 1a and 1b are isolated patterns that do not generate diffracted light.

The auxiliary patterns 2a and 2b each have the size of exposure light limiting resolution or less (h=70 nm) and are arranged at the same pitches in the X- and Y-directions as those of the hole patterns 1a and 1b. That is, the centers of the auxiliary patterns 2a and 2b are all positioned on the X-Y grid of 140 nm pitch. In order to obtain the foregoing phase shift effect also between the hole patterns 1a and 1b and the auxiliary patterns 2a and 2b in the X- and Y-directions, the auxiliary patterns 2a are set to a phase of 0 degrees and the auxiliary patterns 2b are set to a phase of 180 degrees. That is, in this mask, the auxiliary patterns 2a and 2b are disposed at the positions where no hole patterns 1a and 1b are present, and the phases are set so as to be alternately inverted over all the patterns including the hole patterns 1a and 1b and the auxiliary patterns 2a and 2b.

Figure 3:
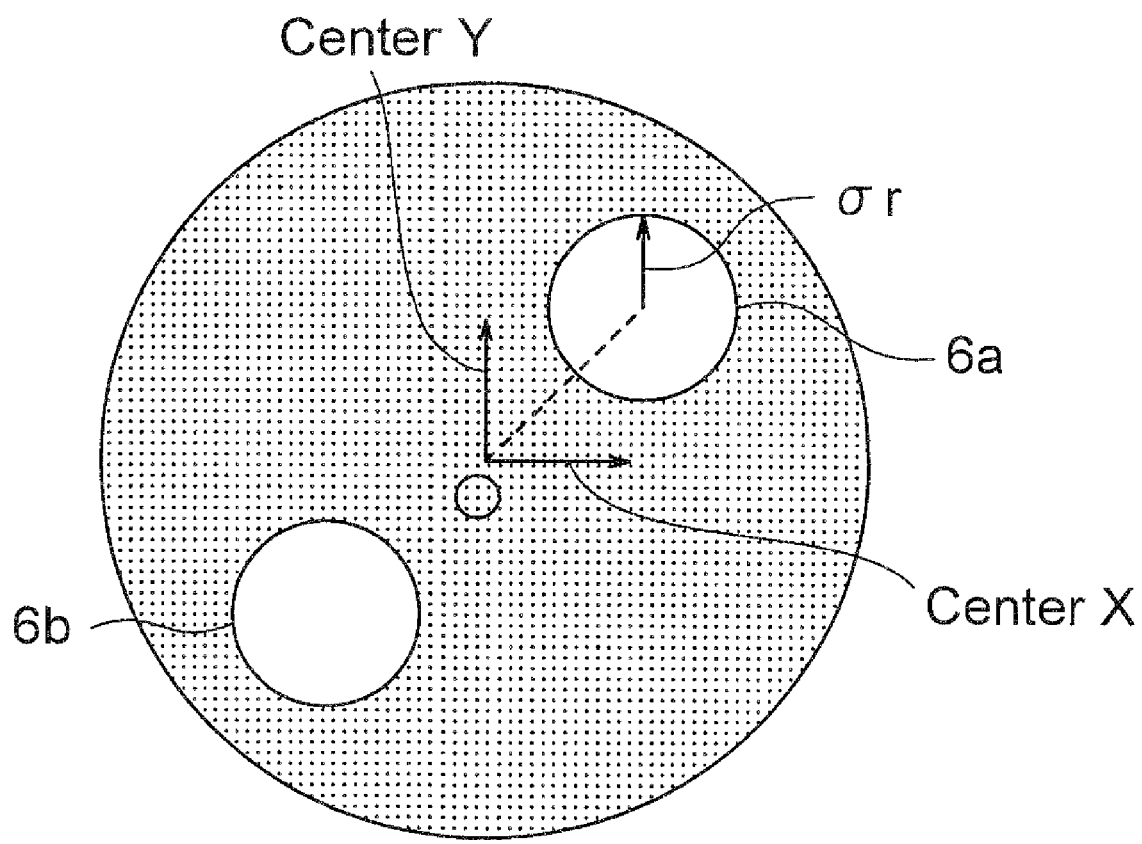
FIG. 3 is a plan view of the pupil plane showing an example of two-point illumination used in the method of the first embodiment.

Then, the mask described above is exposed by the oblique illumination. The oblique illumination is, as shown in FIG. 3, the two-point illumination that improves the resolution properties in the oblique direction with the second smaller pitch. The two-point illumination comprises two circular light sources 6a and 6b, wherein the position of the light source 6a from the center O is set to Center X=Center Y=0.2 and the radius $\sigma_r$ of the light source 6a is set to 0.1, while, the position from the center O of the light source 6b symmetrical to the light source 6a with respect to the center O is set to Center X=Center Y=−0.2 and the radius $\sigma_r$ of the light source 6b is set to 0.1. The numerical aperture NA is set to 0.825.

Figure 4:
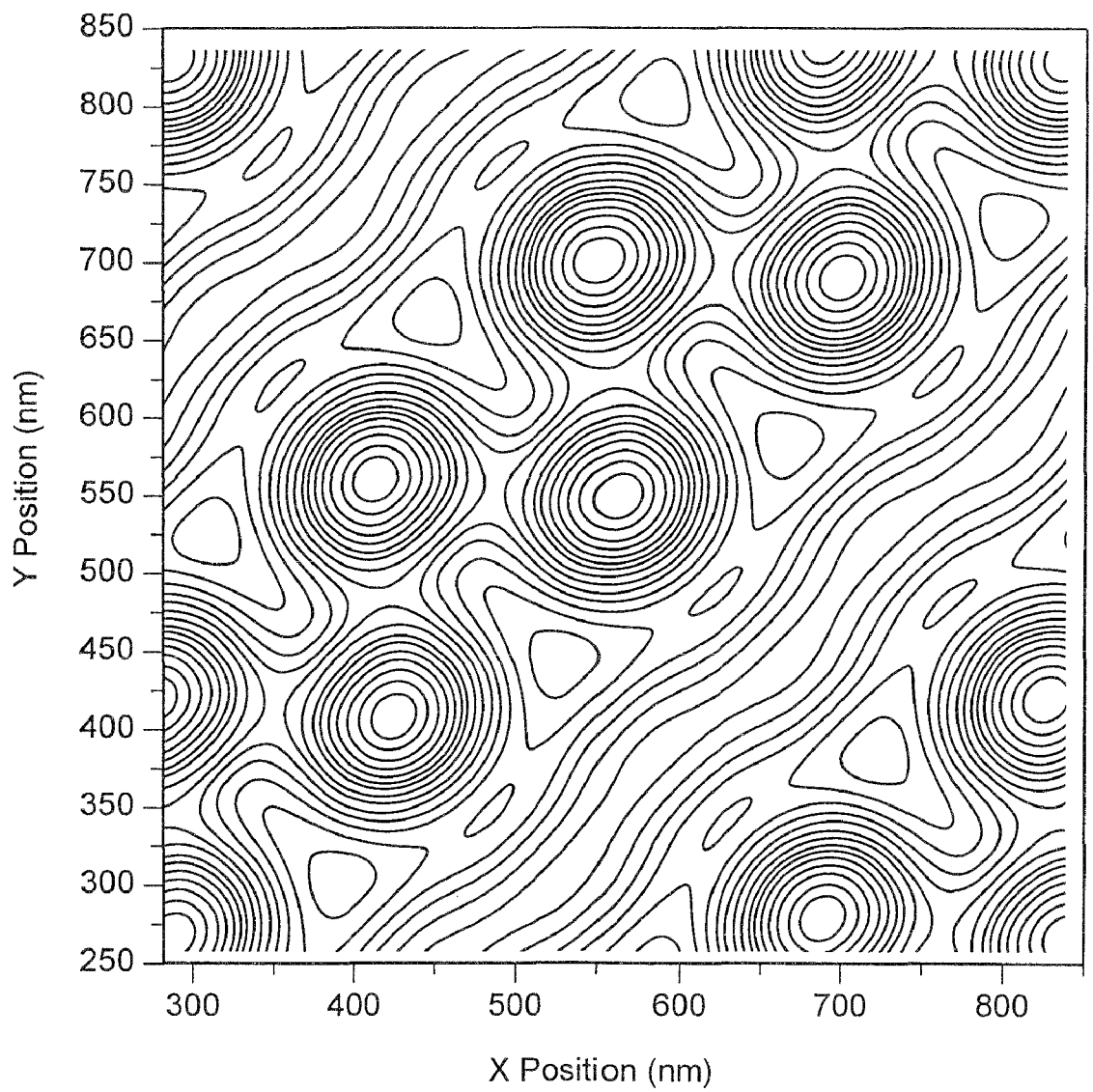
FIG. 4 is a diagram showing a light intensity distribution obtained when the mask of FIG. 2 and the two-point illumination of FIG. 3 are used.

Hereinbelow, the effect of the pattern forming method of the first embodiment will be described based on the results of calculation of light intensity distribution. In the light intensity distribution, as shown in FIG. 4, the interval of contours of the relative light intensity is 0.02, the minimum value of the contour is 0.06, and the maximum value of the contour is 0.36. The maximum value of the contour is obtained near the centers of the hole patterns 1. In the relative light intensity distribution, as the density of the contours between the hole patterns increases, it means that the slope of the light intensity is greater and an excellent pattern can be formed on a wafer. When a resist pattern is estimated using the simplest development model called an exposure threshold model, it is possible to conjecture that a pattern having the same shape as a contour of a certain value is formed on a wafer according to an exposure amount. In the light intensity distribution shown in FIG. 4, it is seen that the contours in the oblique direction of 45 degrees also become dense and the resolution is improved in all the directions of the adjacent hole patterns 1. The development model represents a model in which a resist is dissolved at its portions with a certain value or more of the light intensity while remains as a pattern at its portions with less than the certain value.

Figure 5:
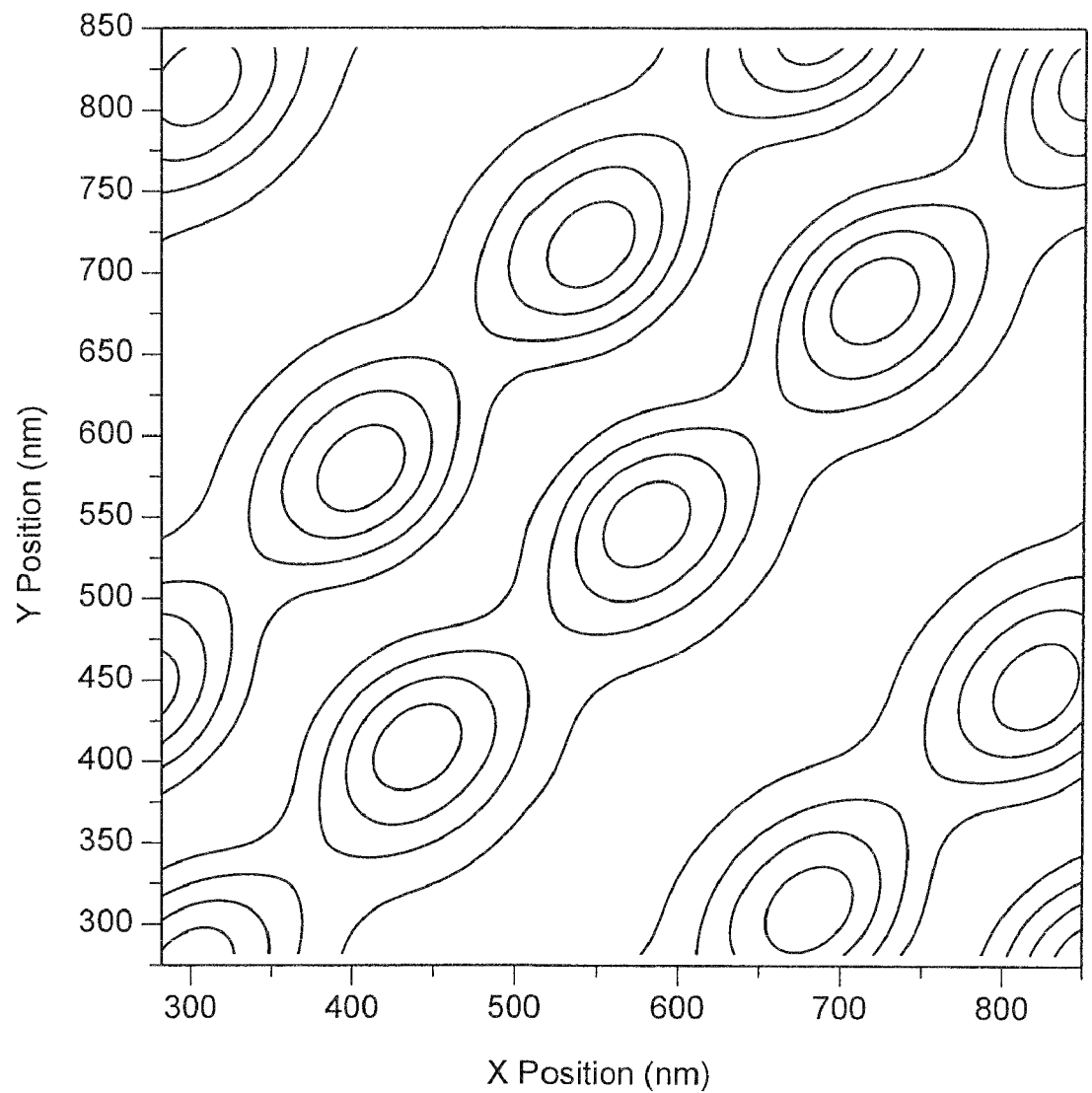
FIG. 5 is a diagram showing a light intensity distribution obtained when the mask of FIG. 2 and small-σ illumination are used.

As a comparative example, FIG. 5 shows the results of simulation when the mask shown in FIG. 2 and general small-σ illumination are used. The optical conditions are such that the numerical aperture NA is set to 0.9 and the coherence factor σ is set to 0.15. In the simulation results, as shown in FIG. 5, the interval of contours of the relative light intensity is 0.01, the minimum value of the contour is 0.1, and the maximum value of the contour is 0.14. It is seen from the simulation results that, as compared with the light intensity distribution shown in FIG. 4, deformation is produced such that a pattern is pulled in the oblique direction of 45 degrees where the hole patterns of the same phase are repeatedly arranged.

From the above results, it can be understood that, according to the pattern forming method of the first embodiment, even when the mask with the asymmetrical layout is exposed by combining the Levenson phase shift mask and the two-point illumination, it is possible to reduce deformation of a pattern transferred onto a wafer by improving the resolution in the X- and Y-directions with the smallest pitch by the phase shift effect and improving the resolution in the oblique direction with the second smaller pitch by the two-point illumination.

Figure 6:
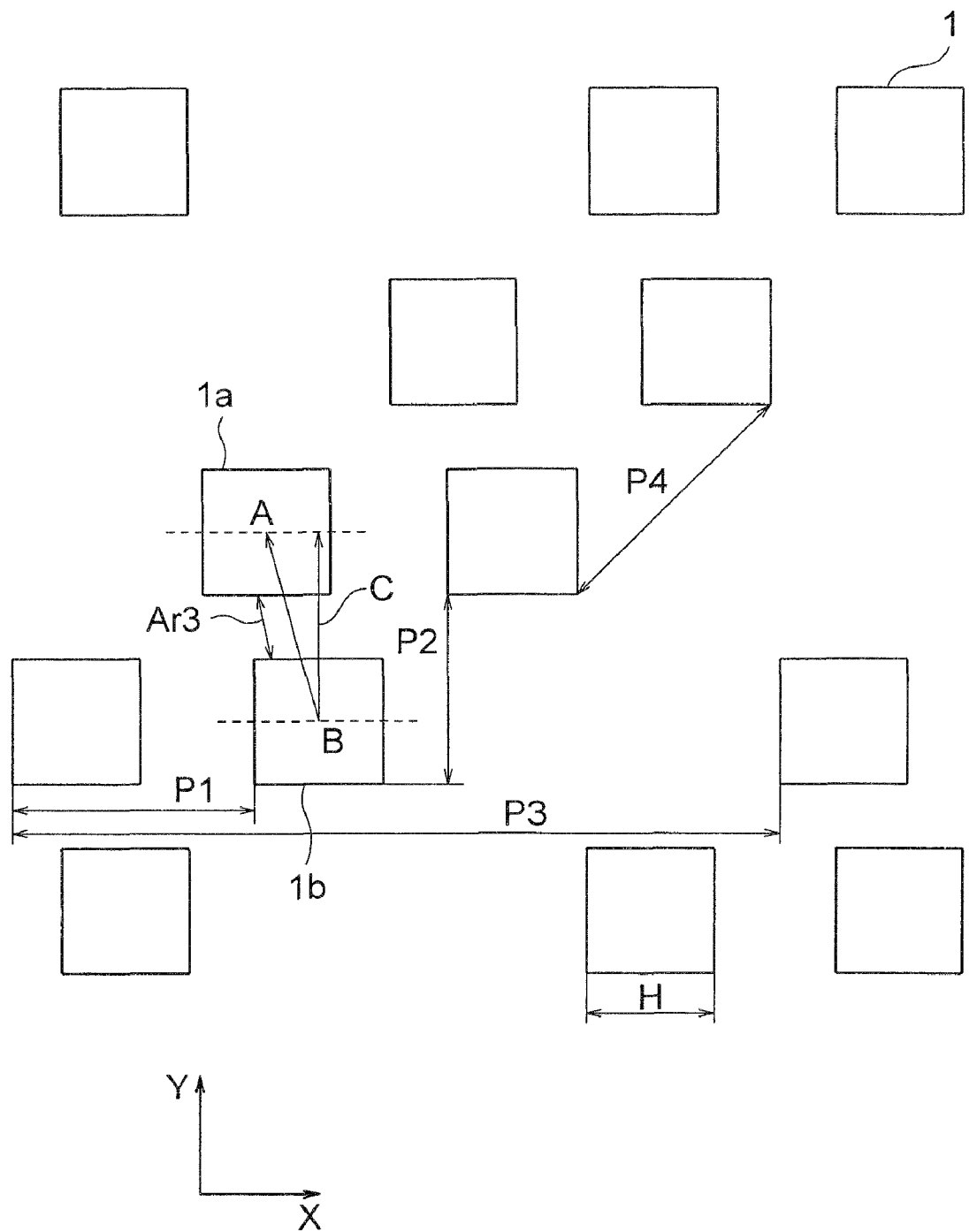
FIG. 6 is a plan view showing a layout of a mask used in a pattern forming method according to a second embodiment of this invention.

FIG. 6 is a plan view showing a layout of a mask used in a pattern forming method according to a second embodiment of this invention. The layout of the mask shown in FIG. 6 is an asymmetrical layout in which a pitch P1 of hole patterns 1 adjacent to each other in the X-direction is greater than that in the asymmetrical layout shown in FIG. 1. Specifically, in this layout, the pitch P1 of the adjacent hole patterns 1 in the X-direction is set to 180 nm, while, a pitch P2 of the adjacent hole patterns 1 in the Y-direction is set to 140 nm equal to that in FIG. 1 and a pitch P3 per two rows of the hole patterns 1 is set to 560 nm equal to that in FIG. 1. Herein, the pitch P2 represents a magnitude of a vector C obtained by resolving a vector, with its initial point at the center B of the hole pattern 1b and its terminal point at the center A of the hole pattern 1a in FIG. 6, in the Y-direction. A mask size H of each hole pattern 1 is for forming a hole of 80 nm on a wafer and is set to 90 nm in consideration of MEEF. In this layout, a pitch P4 in an oblique direction is set to 198 nm. Since P1>P2, the oblique direction is inclined by less than 45 degrees with respect to the X-direction. With this configuration, it is specified that, in the layout shown in FIG. 6, the direction with the smallest pitch is the Y-direction and the direction with the second smaller pitch is the X-direction. In this case, it is difficult to separate the hole patterns relating to the Y-direction indicated by arrow Ar3. This problem is solved by the following technique.

Figure 7:
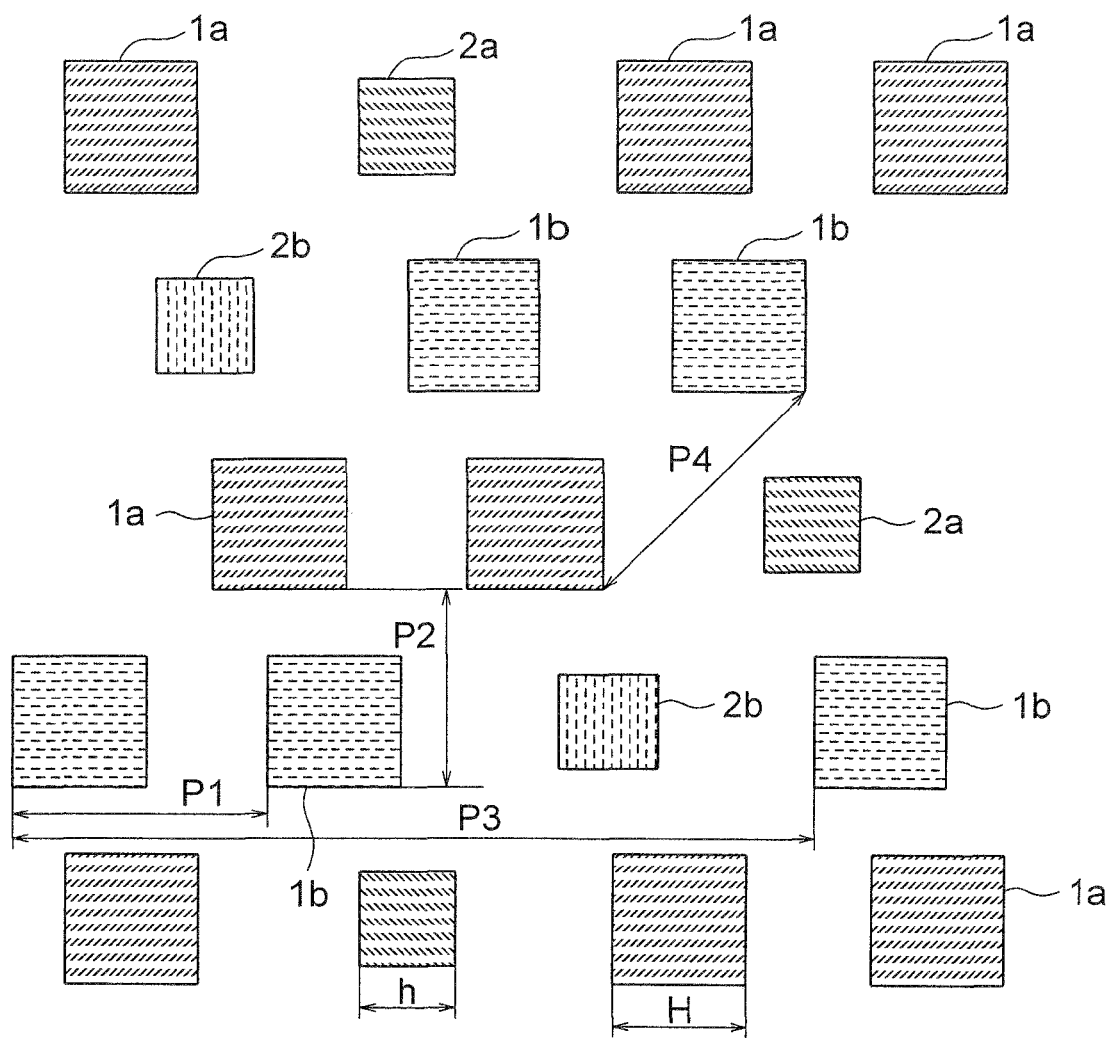
FIG. 7 is a plan view of a mask showing an example of the layout of hole patterns and auxiliary patterns shown in FIG. 6.

In the pattern forming method of the second embodiment, a phase shifter is formed in the Y-direction so as to obtain the phase shift effect and the shape of two-point illumination is set in the X-direction so as to obtain the effect of the two-point illumination. Specifically, as shown in FIG. 7, the phase shifter is formed so as to obtain the phase shift effect between the hole patterns 1a and 1b adjacent to each other in the Y-direction. In this layout, the hole patterns 1a (1b) adjacent to each other in the X-direction have the same phase. On the other hand, the phases of the hole patterns 1a and 1b adjacent to each other in the oblique direction are set opposite to each other (phase difference: 180 degrees) because of the formation of the phase shifter as shown in FIG. 7.

Further, in FIG. 7, auxiliary patterns 2a and 2b are arranged in a row between the rows in the oblique direction of the hole patterns 1a and 1b and the rows in the oblique direction of the hole patterns 1a and 1b adjacent to the former rows at the pitch P3 in the X-direction. The auxiliary patterns 2a and 2b each have a size h of 70 nm.

Figure 8:
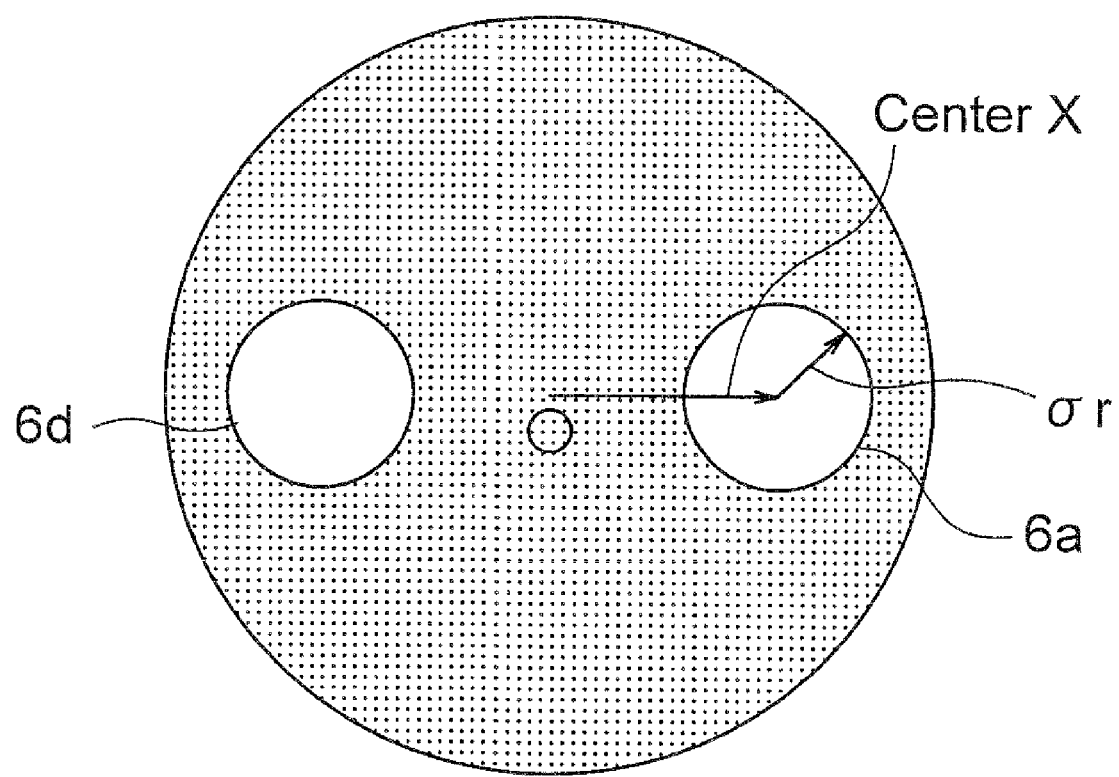
FIG. 8 is a plan view of the pupil plane showing an example of two-point illumination used in the method of the second embodiment.

Next, a description will be given of the oblique illumination used in the pattern forming method. The oblique illumination herein is, as shown in FIG. 8, the two-point illumination that improves the resolution properties in the X-direction with the second smaller pitch. The two-point illumination comprises two circular light sources 6c and 6d, wherein the position of the light source 6c from the center O is set to Center X=0.45 and Center Y=0 and the radius $\sigma_r$ of the light source 6c is set to 0.1, while, the position of the light source 6d from the center O is set to Center X=−0.45 and Center Y=0 and the radius $\sigma_r$ of the light source 6d is set to 0.1. The numerical aperture NA is set to 0.825.

Figure 9:
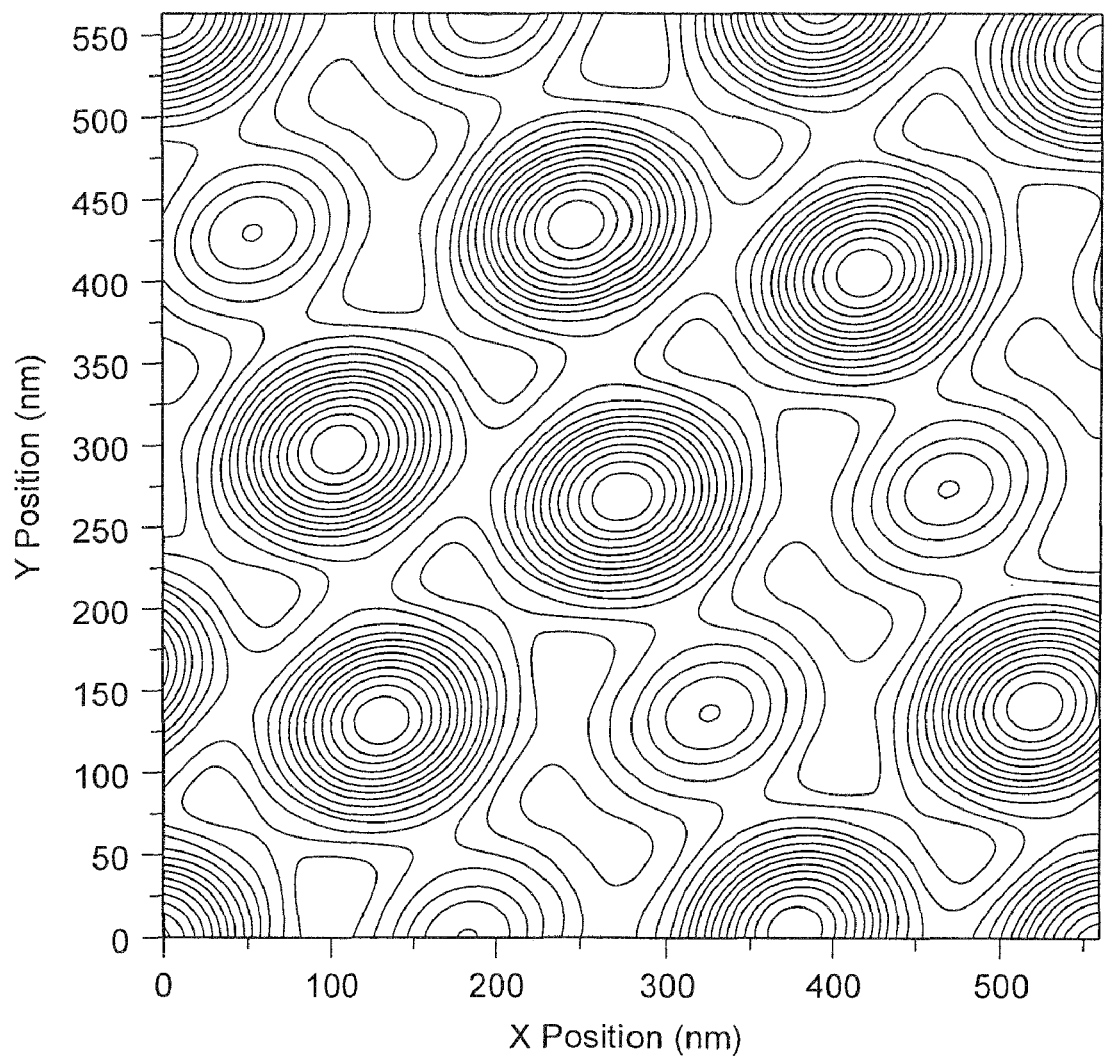
FIG. 9 is a diagram showing a light intensity distribution obtained when the mask of FIG. 7 and the two-point illumination of FIG. 8 are used.

Hereinbelow, the effect of the pattern forming method of the second embodiment will be described based on the results of calculation of light intensity distribution. In the light intensity distribution, as shown in FIG. 9, the interval of contours of the relative light intensity is 0.02, the minimum value of the contour is 0.06, and the maximum value of the contour is 0.36. In the light intensity distribution shown in FIG. 9, it is seen that the contours in the oblique direction of 45 degrees also become dense and the resolution is improved in all the directions of the adjacent hole patterns 1a and 1b.

Figure 10:
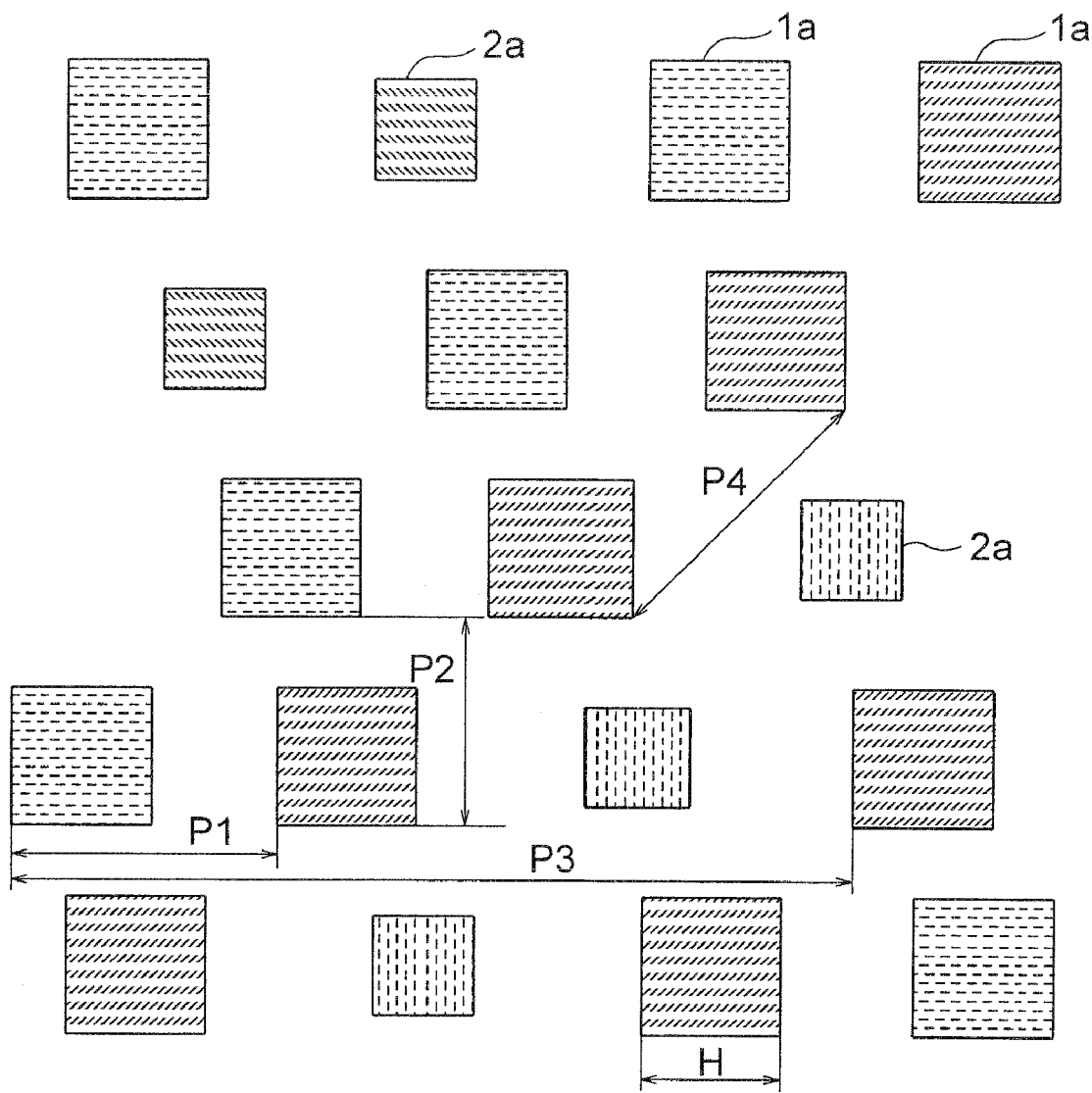
FIG. 10 is a plan view of a mask as a comparative example of the mask shown in FIG. 7.
Figure 11:
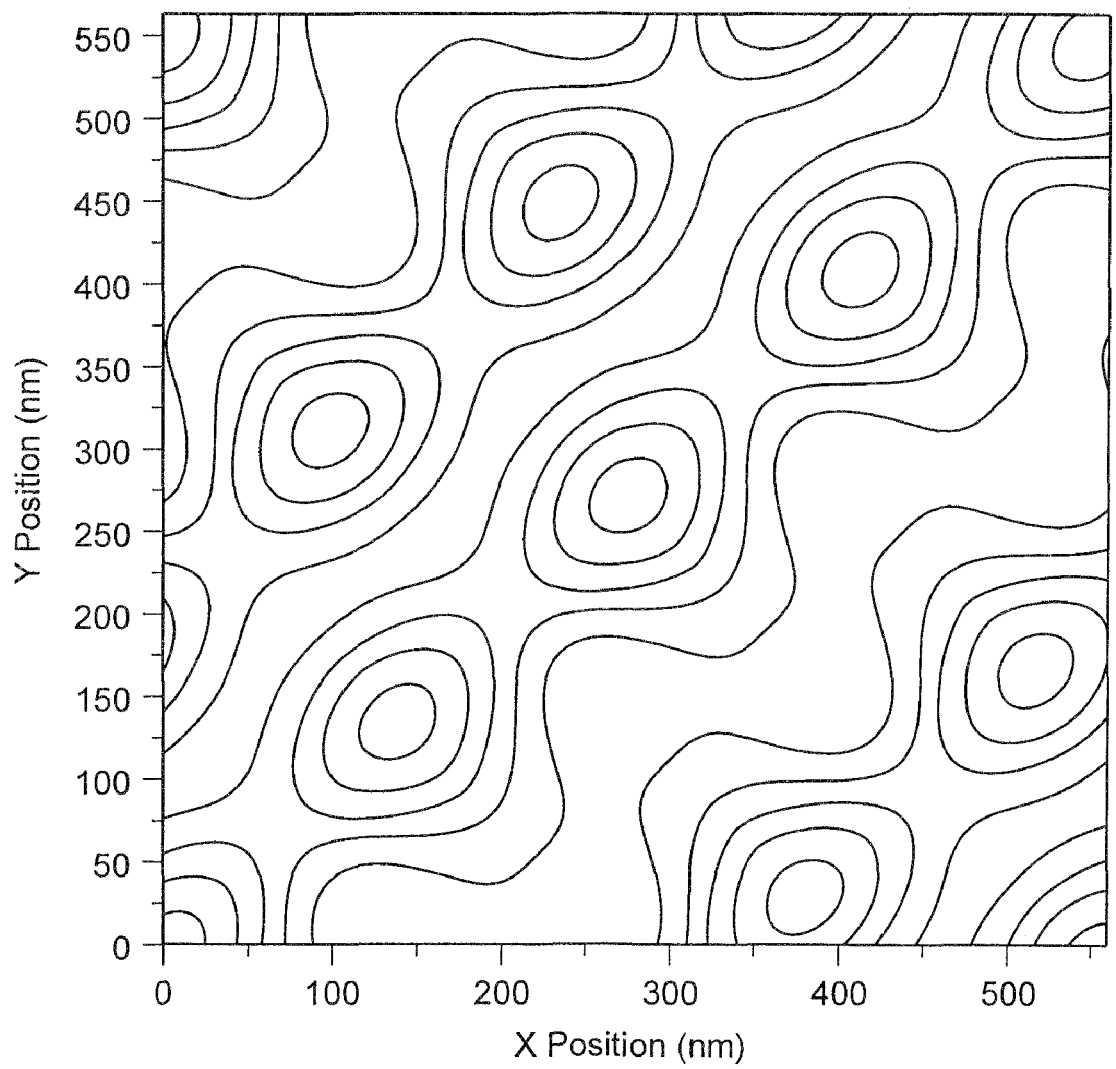
FIG. 11 is a diagram showing a light intensity distribution obtained when the mask of FIG. 10 and small-c illumination are used.

As a comparative example, FIG. 11 shows a light intensity distribution obtained when a mask of FIG. 10 and general small-c illumination are used. The optical conditions are such that NA=0.9 and σ=0.25. The mask of the comparative example is the same as the mask shown in FIG. 7 with respect to a layout of hole patterns 1a and 1b and auxiliary patterns 2a and 2b, but differs therefrom in that the phases of transmitted light through the hole patterns 1a and 1b adjacent to each other in the X- and Y-directions, respectively, are set so as to be alternately inverted. That is, in this mask, on the layout, the hole patterns 1a (1b) repeatedly arranged in the oblique direction are set so as to have the same phase.

In the light intensity distribution of the comparative example, as shown in FIG. 11, the interval of contours of the relative light intensity is 0.01, the minimum value of the contour is 0.03, and the maximum value of the contour is 0.09. In this light intensity distribution, it is seen that, as compared with the light intensity distribution shown in FIG. 9, deformation is produced such that a pattern is pulled in the oblique direction. Therefore, according to the pattern forming method of the second embodiment, even when the mask with the asymmetrical layout is exposed by combining the Levenson phase shift mask and the two-point illumination, it is possible to reduce deformation of a pattern transferred onto a wafer like in the pattern forming method of the first embodiment.

Figure 12:
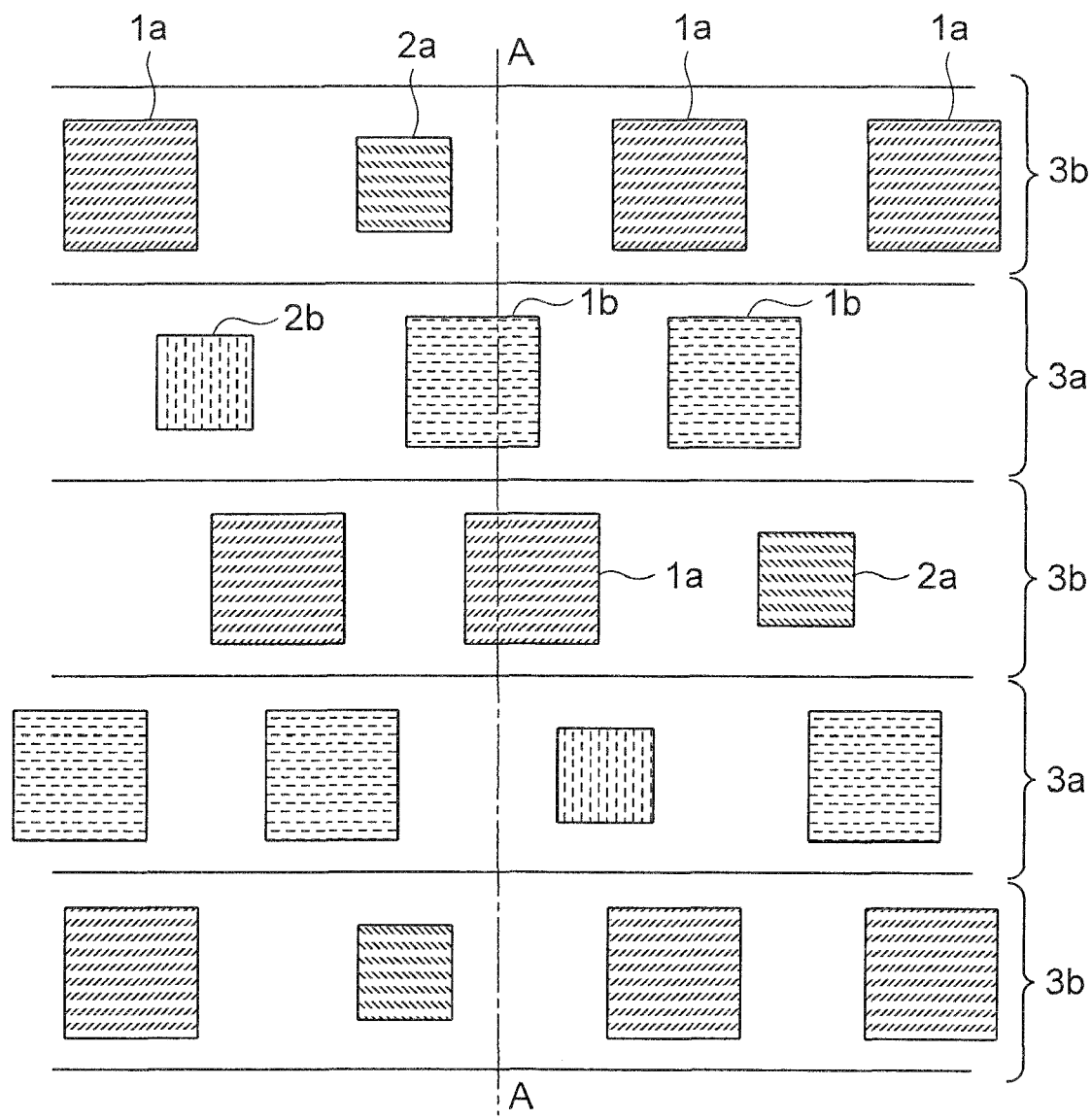
FIG. 12 is a plan view of a mask showing an example of a layout of hole patterns and auxiliary patterns used in a pattern forming method according to a third embodiment of this invention.

FIG. 12 is a plan view showing a layout of a mask used in a pattern forming method according to a third embodiment of this invention. As compared with the mask shown in FIG. 7, the mask of FIG. 12 is the same with respect to a layout of hole patterns 1a and 1b and auxiliary patterns 2a and 2b, but differs in using a halftone phase shift mask in phase setting. In the pattern forming method of the third embodiment, this mask is exposed using two-point illumination adapted to improve the resolution properties in the X-direction. As shown in FIG. 12, the mask has semitransparent regions 3a and 3b each adapted to invert the phase of transmitted light therethrough. The semitransparent region 3b is arranged around the hole patterns 1a and the auxiliary patterns 2a each in the form of an opening with a phase of 0 degrees and serves to cause the phase of transmitted light therethrough to be 180 degrees. On the other hand, the semitransparent region 3a is arranged around the hole patterns 1b and the auxiliary patterns 2b each in the form of an opening with a phase of 180 degrees and serves to cause the phase of transmitted light therethrough to be 0 degrees.

Figure 13:
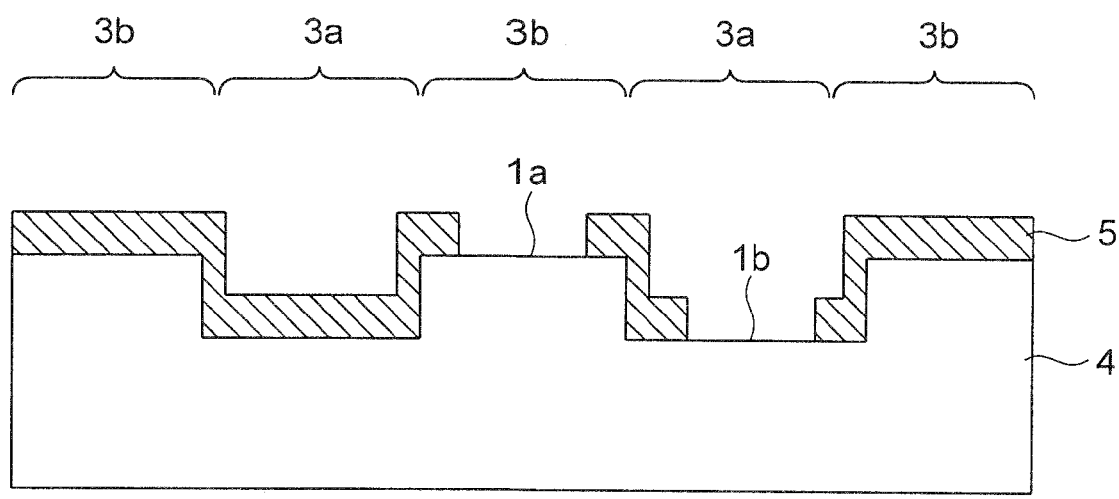
FIG. 13 is an A-A line sectional view showing an example of a sectional structure of the mask shown in FIG. 12.

FIG. 13 is an A-A line sectional view showing an example of a sectional structure of the mask shown in FIG. 12. In this sectional view, the mask is shown with its top and bottom reversed as compared with a state of its actual use and is actually used with its pattern surface facing downward. The mask has a stacked structure comprising a mask substrate 4 and a semitransparent film 5 formed on the mask substrate 4. The mask is fabricated by etching the mask substrate 4 to form a level difference corresponding to a Levenson phase shift, then forming the semitransparent film 5 for a halftone phase shift and processing the hole patterns 1a and 1b.

Figure 14:
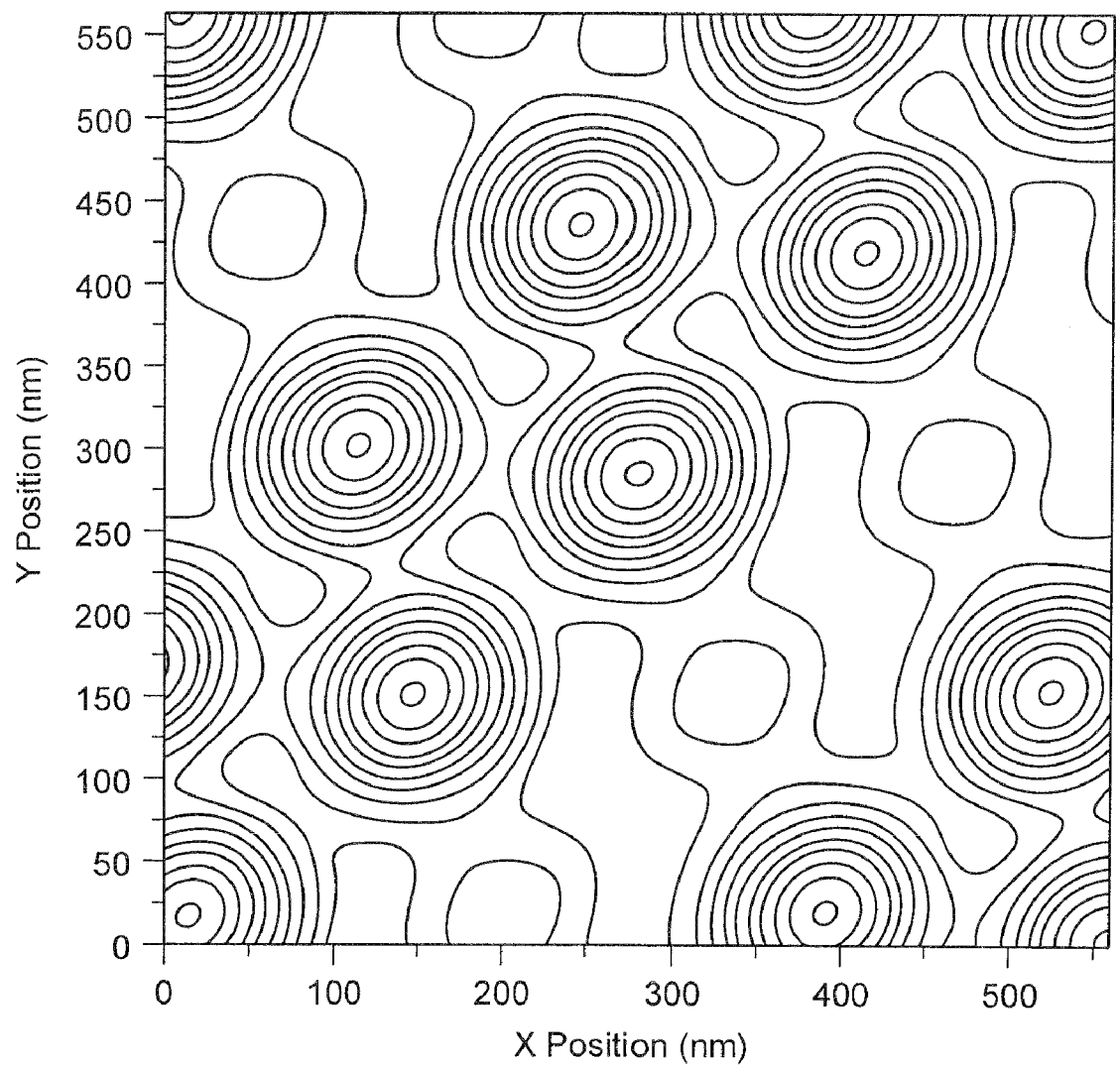
FIG. 14 is a diagram showing a light intensity distribution obtained when the mask of FIG. 12 and two-point illumination are used.
Figure 15A:
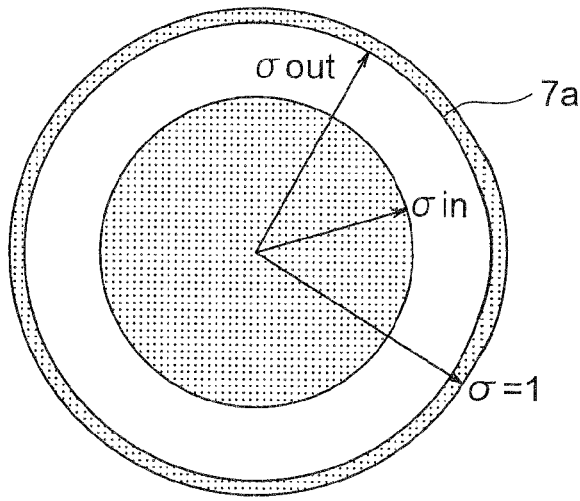
FIGS. 15A to 15C are plan views of the pupil planes showing typical examples of oblique illumination.
Figure 15B:
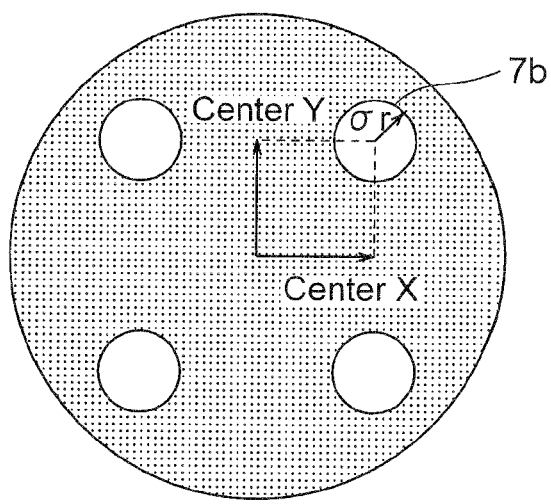
Figure 15C:
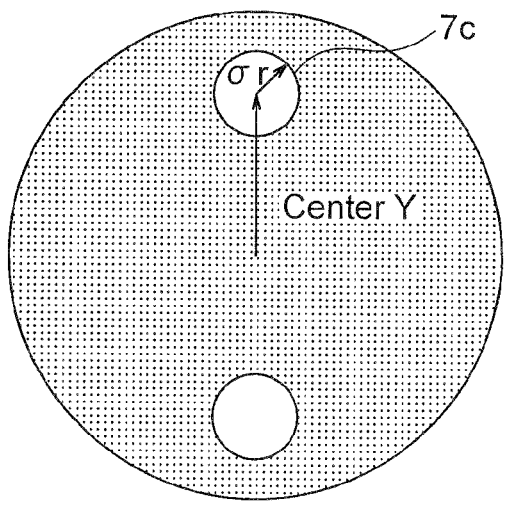

Hereinbelow, the effect of the pattern forming method of the third embodiment will be described based on the results of calculation of light intensity distribution. The optical conditions in the two-point illumination are such that NA=0.825, Center X=0.375, and radius $\sigma_r$=0.1. In the light intensity distribution, as shown in FIG. 14, the interval of contours of the relative light intensity is 0.02, the minimum value of the contour is 0.06, and the maximum value of the contour is 0.26. In this light intensity distribution, it is seen that although the resolution is slightly lowered as compared with the light intensity distribution shown in FIG. 9, the contours in the oblique direction of 45 degrees become dense as compared with the light intensity distribution shown in FIG. 11 and further the contrast in the X-direction is also improved. Therefore, according to the pattern forming method of the third embodiment, even when the mask with the asymmetrical layout is exposed by combining the halftone phase shift mask and the two-point illumination, it is possible to reduce deformation of a pattern transferred onto a wafer.

In the foregoing embodiments, the description has been given of the transmission type masks for use in ArF excimer laser exposure. However, this invention is not limited thereto and is also applicable to other masks, such as a reflection type mask for EUV (extreme ultraviolet) exposure (wavelength: 13 nm), i.e. a mask in which a pattern of an absorbent material is formed on a laminated reflecting mirror, regardless of wavelengths and mask types. The hole patterns 1 are each shown to be square, but not limited thereto, and may have an oblong rectangular shape or a shape having projections at corners thereof by performing a process of correcting a mask using a transfer pattern called OPC (Optical Proximity Correction) so as to obtain a desired shape.

Further, in the foregoing embodiments, the description has been given of the cases where P1=P2<P4 and P2<P1<P4 (P1 represents the pitch of the hole patterns 1 in the X-direction, P2 represents the pitch thereof in the Y-direction, and P4 represents the pitch thereof in the oblique direction). However, this invention is not limited thereto. It is considered that the resolution improving effect can be obtained even in the case of P2=P4<P1, P1=P4<P2, or the like. Further, the description has been given of only the two-point illumination as the oblique illumination, but, for example, when there are two directions each with the second smaller pitch, it is considered that the above effect can be obtained by using the four-point illumination.

A pattern forming method according to this invention can adopt the following configurations.

The predetermined directions include a transverse direction (X-direction), a longitudinal direction (Y-direction) substantially perpendicular to the transverse direction, and an oblique direction defined by a pitch (P1) in the transverse direction and a pitch (P2) in the longitudinal direction. In this case, a mask has an asymmetrical layout when patterns are repeated in the oblique direction.

The oblique direction is a direction inclined by 45 degrees with respect to the transverse direction. As such a layout, there is, for example, a pattern layout for use in an exposure process for DRAM (Dynamic Random Access Memory).

The oblique illumination is two-point illumination. In this case, it is possible to improve the resolution properties for patterns repeated in one direction.

In a pattern arranging step, auxiliary patterns (2a, 2b) each having a size of exposure light limiting resolution or less are repeatedly arranged on the mask in each of the predetermined directions. In this case, the auxiliary patterns are not transferred onto a wafer, but are capable of narrowing the light intensity distribution of rectangular patterns (1a, 1b) and improving the contrast, and therefore, the auxiliary patterns can improve the resolution of the rectangular patterns even if isolated from each other.

A phase shifter is formed for the auxiliary patterns repeatedly arranged in a first direction. In this case, it is possible to further improve the resolution of the rectangular patterns repeatedly arranged in the first direction.

The phase shifter may be formed by partially using a transparent film in light-transmissive regions of the mask or may be formed by etching a mask substrate in light-transmissive regions of the mask to a predetermined depth. In this case, the phase shifter serves as a Levenson phase shift mask and can enhance the resolution improving effect.

The phase shifter may be formed by using a semitransparent film around light-transmissive regions of the mask. In this case, the phase shifter serves as a halftone phase shift mask.

The rectangular patterns each may have a square shape.

Although the invention has been described in connection with the several embodiments, it will be appreciated by those skilled in the art that those embodiments are provided solely for illustrating the invention, and should not be relied upon to construe the appended claims in a limiting sense.

What is claimed is:

1. A method, comprising:
providing a mask over a semiconductor wafer, the mask comprising a plurality of rectangular patterns spaced apart from one another in a two dimensional plane;
wherein a first group of said rectangular patterns are phase shift patterns and a second group of said rectangular patterns are zero phase degree shift patterns, wherein said rectangular patterns that are adjacent to one another in one of an X-axis direction, a Y-axis direction and a slant direction relative to the two dimensional plane belong to a same one of said first and second groups, and wherein said rectangular patterns that are adjacent to one another along the other two of said X-axis, Y-axis and slant directions alternate between said first and second groups; and
performing a two-point illumination with an oblique illumination on the mask in said direction along which said rectangular patterns belong to a same one of said first and second groups.

2. The method as claimed in claim 1, wherein said direction along which said rectangular patterns belong to a same one of said first and second groups is the slant direction.

3. The method as claimed in claim 1, wherein said direction along which said rectangular patterns belong to a same one of said first and second groups is the X-axis direction.

4. The method as claimed in claim 1, wherein said direction along which said rectangular patterns belong to a same one of said first and second groups is the Y-axis direction.

5. The method as claimed in claim 1, wherein the phase shift patterns are formed by partially using a transparent film in light-transmissive regions of the mask.

6. The method as claimed in claim 1, wherein the phase shift patterns are formed by etching a mask substrate in light-transmissive regions of the mask to a predetermined depth.

7. The method as claimed in claim 1, wherein the phase shift patterns are formed by using a semitransparent film around light-transmissive regions of the mask.

* * * * *